(12) United States Patent
Takahata et al.

(10) Patent No.: US 8,980,169 B2
(45) Date of Patent: Mar. 17, 2015

(54) HIGH-PURITY LANTHANUM, SPUTTERING TARGET COMPRISING HIGH-PURITY LANTHANUM, AND METAL GATE FILM MAINLY COMPRISING HIGH-PURITY LANTHANUM

(75) Inventors: Masahiro Takahata, Ibaraki (JP); Yuichiro Shindo, Ibaraki (JP); Gaku Kanou, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 622 days.

(21) Appl. No.: 12/810,319

(22) PCT Filed: Oct. 31, 2008

(86) PCT No.: PCT/JP2008/069854
§ 371 (c)(1),
(2), (4) Date: Jun. 24, 2010

(87) PCT Pub. No.: WO2009/084318
PCT Pub. Date: Jul. 9, 2009

(65) Prior Publication Data
US 2010/0272596 A1  Oct. 28, 2010

(30) Foreign Application Priority Data
Dec. 28, 2007  (JP) .................. 2007-338423

(51) Int. Cl.
| | |
|---|---|
| C22C 28/00 | (2006.01) |
| C21D 1/00 | (2006.01) |
| C23C 14/00 | (2006.01) |
| C22B 9/22 | (2006.01) |
| C22B 59/00 | (2006.01) |
| C23C 14/34 | (2006.01) |
| H01L 21/28 | (2006.01) |
| H01L 21/285 | (2006.01) |
| H01L 29/49 | (2006.01) |

(52) U.S. Cl.
CPC ............... *C22C 28/00* (2013.01); *C22B 9/228* (2013.01); *C22B 59/00* (2013.01); *C23C 14/3414* (2013.01); *H01L 21/28079* (2013.01); *H01L 21/2855* (2013.01); *H01L 29/495* (2013.01)
USPC .................. 420/416; 148/565; 204/298.13

(58) Field of Classification Search
CPC  C23C 14/3414; H01L 21/2855; C22B 59/00; C22C 28/00
USPC ............ 420/416; 75/10.13; 204/298.13; 148/565, 903
See application file for complete search history.

(56) References Cited

U.S. PATENT DOCUMENTS

| | | | |
|---|---|---|---|
| 4,265,862 A | 5/1981 | White et al. | |
| 5,513,834 A | 5/1996 | Feldewerth et al. | |
| 7,344,660 B2 | 3/2008 | Hosono et al. | |
| 2005/0023130 A1 | 2/2005 | Suzuki et al. | |
| 2007/0003790 A1* | 1/2007 | Tsukatani et al. | 428/702 |
| 2007/0131545 A1 | 6/2007 | Okabe et al. | |
| 2011/0114481 A1 | 5/2011 | Satoh et al. | |
| 2011/0114482 A1 | 5/2011 | Satoh et al. | |
| 2011/0162322 A1 | 7/2011 | Satoh et al. | |
| 2011/0290644 A1 | 12/2011 | Tsukamoto et al. | |
| 2011/0308940 A1 | 12/2011 | Tsukamoto et al. | |
| 2012/0045380 A1 | 2/2012 | Satoh et al. | |
| 2013/0241010 A1 | 9/2013 | Takahata et al. | |
| 2013/0313659 A1 | 11/2013 | Takahata et al. | |
| 2014/0199203 A1 | 7/2014 | Takahata et al. | |

FOREIGN PATENT DOCUMENTS

| | | |
|---|---|---|
| FR | 2661425 A1 | 10/1991 |
| JP | 08-092662 A | 4/1996 |
| JP | 2007-169683 A | 7/2007 |

OTHER PUBLICATIONS

Patnaik Ph.D., Pradyot, Lanthanum, Handbook of Inorganic Chemicals, McGraw-Hill, 2003, 443-446.*
E. Tokumitsu et al., "A Study on High-Dielectric-Constant Oxide Materials for MOSFET Gate Insulator Applications", Denshi-zairyo Kenkyu-kai Shiryo of Institute of Electrical Engineers of Japan, vol. 6-13, pp. 37-41, Sep. 21, 2000.
Kouji Mimura et al., "Purification of Metals Ce and La by Plasma Zone Melting Method", Collected Abstracts of the 2006 Spring Meeting of the Japan Institute Metals, the Japan Institute Metals, vol. 138, p. 304, Mar. 21, 2006.

(Continued)

*Primary Examiner* — Roy King
*Assistant Examiner* — Caitlin Kiechle
(74) *Attorney, Agent, or Firm* — Howson & Howson LLP

(57) ABSTRACT

Provided are high-purity lanthanum, wherein the purity excluding rare-earth elements and gas components is 4N or higher, and amounts of aluminum, iron and copper in the lanthanum are respectively 100 wtppm or less; as well as high-purity lanthanum, wherein the purity excluding rare-earth elements and gas components is 4N or higher, amounts of aluminum, iron and copper in the lanthanum are respectively 100 wtppm or less, oxygen content is 1500 wtppm or less, elements of alkali metals and alkali earth metals are respectively 1 wtppm or less, elements of transition metals and high-melting-point metals other than those above are respectively 10 wtppm or less, and radioactive elements are respectively 10 wtppb or less. The invention aims to provide technology capable of efficiently and stably providing high-purity lanthanum, a sputtering target comprising high-purity lanthanum, and a thin film for metal gate mainly comprising high-purity lanthanum.

8 Claims, No Drawings

(56) References Cited

OTHER PUBLICATIONS

L.O. Valoen et al., "Structure and Related Properties of (La, Ce, Nd, Pr)Ni5 Alloys", Journal of Alloys and Compounds, Elsevier, vol. 306, No. 1-2, pp. 235-244, Jun. 1, 2000.

K. Shima, "Process of High-Purity Metals and Physical Property", CMC Publishing Co., Ltd., Trade Edition, 1st Printing, pp. 8 and 124-129, Dec. 2000.

Zhang Di et al., "Characterization of Stacking Faults on Basal Planes in Intermetallic compounds La5Ni19 and La2Ni7", Intermetallics, Elsevier, vol. 8, No. 4, pp. 391-397, Apr. 1, 2000.

Theodosia Gougousi et al., "Properties of La-Silicate High-K Dielectric Films Formed by Oxidation of La on Silicon", Journal of Applied Physics, American Institute of Physics, vol. 93, No. 3, pp. 1691-1696, Feb. 1, 2003.

W.R. Pedreira et al., "Determination of Trace Amounts of Rare Earth Elements in High Pure Lanthanum Oxide by Sector Field Inductively Coupled Plasma Mass Spectrometry (HR ICP-MS) and High-Performance Liquid Chromatography (HPLC) Techniques", Journal of Alloys and Compounds, Elsevier, vol. 344, No. 1-2, pp. 17-20, Oct. 7, 2002.

Zhi Youbao, "Problems of Rare Earth Minerals Production in China and its Future", Gansu Metallurgy, vol. 29, No. 1, pp. 44-45, Feb. 2007.

Rare Handbook Editorial Board, "Rare Manual", Metallurgical Industry Press, p. 927, 1995 (month unknown).

* cited by examiner

HIGH-PURITY LANTHANUM, SPUTTERING TARGET COMPRISING HIGH-PURITY LANTHANUM, AND METAL GATE FILM MAINLY COMPRISING HIGH-PURITY LANTHANUM

BACKGROUND OF THE INVENTION

The present invention relates to high-purity lanthanum, a sputtering target comprising high-purity lanthanum, and a metal gate film mainly comprising high-purity lanthanum.

Lanthanum (La) is one of the rare-earth elements, and is a mineral resource that is contained in the earth's crust as a mixed composite oxide. Rare-earth elements are so called because they are separated from relatively rare minerals, but they are not that rare in light of the overall earth's crust. Lanthanum is a white metal having an atomic number of 57 and an atomic weight of 138.9, and comprises a double hexagonal close-packed structure at normal temperature. Lanthanum has a melting point of 921° C., boiling point of 3500° C., and density of 6.15 g/cm$^3$, its surface is oxidized in the atmosphere, and it gradually melts in water. Lanthanum is soluble in hot water and acid. Although it is not ductile, it is slightly malleable. Lanthanum's resistivity is 5.70×10$^{-6}$ Ωcm, and it becomes oxide (La$_2$O$_3$) when burned at 445° C. or higher (refer to Dictionary of Physics and Chemistry).

With rare-earth elements, it is generally said that compounds with the oxidation number 3 are stable, and lanthanum is also trivalent. In recent years, lanthanum is a metal that is attracting attention as an electronic material such as a metal gate material or a high-permittivity (High-k) material, and research and development is being promoted.

Lanthanum metal is a material in which high purification is difficult to achieve since it is easily oxidized during the refining process, and a high-purity product thereof did not exist to date. In addition, if lanthanum metal is left in the atmosphere, there is a problem in that the handling thereof is difficult since it will become oxidized in a short time and tarnished to a black color.

In recent years, thinning of a gate insulator film in the next-generation MOSFET is being demanded, but with the SiO$_2$ that has been conventionally used as the gate insulator film, the leak current increases due to the tunnel effect, and normal operation is becoming difficult.

Thus, as a substitute for the SiO$_2$ described above, HfO$_2$, ZrO$_2$, Al$_2$O$_3$ and La$_2$O$_3$ with high permittivity, high thermal stability, and high energy barrier against the holes and electrons in the silicon have been proposed. In particular, among the foregoing materials, La$_2$O$_3$ is valued highly, and a research on its electrical properties and for its use as a gate insulator film in the next-generation MOSFET has been reported (refer to Non Patent Document 1). Nevertheless, with Non Patent Document 1, the subject of research is a La$_2$O$_3$ film, and it does not make any reference to the properties and behavior of La element.

It could be said that lanthanum (lanthanum oxide) is still in the research phase. When studying the properties of such lanthanum (lanthanum oxide), if lanthanum metal itself exists as a sputtering target material, it is possible to form a lanthanum thin film on a substrate and it will be easy to study the behavior at the interface with the silicon substrate and the properties of a high-permittivity gate insulator film or the like by forming a lanthanum compound. There is also a significant advantage in that the freedom of the target as a product will increase.

Nevertheless, even if a lanthanum sputtering target is prepared, as described above, it becomes oxidized in a short time (approximately 10 minutes) in the atmosphere. When an oxide film is formed on the target, the electrical conductivity will deteriorate and thereby cause defective sputtering. In addition, if the lanthanum sputtering target is left in the atmosphere for a long time, it reacts with the moisture in the air and becomes covered with white hydroxide powder, and it may even cause a problem of not allowing normal sputtering to be performed. Thus, after the target is prepared, it is necessary to take antioxidant measures such as by immediately performing vacuum packing or coating the target with fats or oils, but these are extremely complicated processes. In light of the foregoing problems, the actual condition is that a target material based on a lanthanum element has not yet been put into practical application.

[Non Patent Document 1] Written by Eisuke Tokunaga and two others, "Research on Oxide Material for High-k Gate Insulator Film", The Institute of Electrical Engineers of Japan, Research Paper of Electronic Materials, Vol. 6-13, Pages 37 to 41, Published on Sep. 21, 2001

SUMMARY OF THE INVENTION

An object of this invention is to provide technology capable of efficiently and stably providing high-purity lanthanum, a sputtering target comprising high-purity lanthanum, and a thin film for metal gate mainly comprising high-purity lanthanum.

As described in the foregoing conventional technology, lanthanum is a material that easily bonds with oxygen and from which oxygen cannot be eliminated easily. Nevertheless, the present invention enables to obtain high-purity lanthanum having a purity of 4N or higher excluding rare-earth elements and gas components, and containing 100 wtppm or less each of aluminum, iron and copper in the lanthanum. The foregoing high-purity lanthanum is a novel substance, and is covered by the present invention.

A LaOx film is mainly formed for use as a gate insulator film in MOSFET. When forming this kind of film, high-purity lanthanum metal is required in order to form an arbitrary film; that is, in order to increase the freedom in forming the film. The present invention is able to provide a material capable of complying with the foregoing requirement.

The rare-earth elements contained in lanthanum include Sc, Y, Ce, Pr, Nd, Pm, Sm, Eu, Gd, Tb, Dy, Ho, Er, Tm, Yb, and Lu in addition to lanthanum (La), but it is difficult to separate and refine these elements from La since they have similar properties. In particular, since Ce is approximate to La, it is difficult to reduce Ce.

Nevertheless, since these rare-earth elements have approximate properties, so as long as the total amount of rare-earth elements is less than 1000 wtppm, there is no particular problem when used as an electronic component material.

Accordingly, with lanthanum of the present invention, the inclusion of rare-earth elements at the foregoing level is tolerable. Nevertheless, in order to take advantage of the properties of the lanthanum element, the total amount of rare-earth elements excluding lanthanum is preferably 100 wtppm or less, more preferably 10 wtppm or less, and, even more preferably, the content of the respective rare-earth elements is 1 wtppm or less. The present invention is able to achieve the above and covers all of these.

Generally speaking, C, N, O, S and H exist as gas components. These gas components may exist as independent elements, but in many cases they exist as compounds (CO, CO$_2$, SO$_2$ and so on) or sometimes exist in the form of compounds with the constituent elements. Since these gas component elements have a small atomic weight and atomic radius, unless they are contained in large amounts, they will hardly affect the properties of the material even when existing as impurities. Accordingly, when indicating purity, it is common practice to indicate the purity excluding gas components.

In this respect, the lanthanum of the present invention achieves a purity of 4N or higher excluding gas components. With lanthanum refined to this level, the gas components will also decrease proportionately. For instance, there will be no particular problem if the amount of oxygen contained in the lanthanum is 2000 wtppm or less, or in certain cases 5000 wtppm or less.

Nevertheless, it should be understood that the present invention is not aiming to achieve an oxygen content of near 5000 wtppm. Specifically, it goes without saying that it is desirable for the amount of oxygen to be as low as possible. The present invention aims to achieve an oxygen content of 1500 wtppm or less and even less than 1000 wtppm, and has achieved the foregoing figures.

Moreover, the present invention provides high-purity lanthanum, wherein the purity excluding rare-earth elements and gas components is 4N or higher, amounts of aluminum, iron and copper in the lanthanum are respectively 100 wtppm or less, oxygen content is 1500 wtppm or less, elements of alkali metals and alkali earth metals are respectively 1 wtppm or less, elements of transition metals and high-melting-point metals other than those above are respectively 10 wtppm or less, and radioactive elements are respectively 10 wtppb or less.

The lanthanum obtained as described above is subject to melting in a vacuum and then solidified into an ingot. The ingot is cut into a prescribed size and polished to form a sputtering target. It is thereby possible to obtain a sputtering target comprising high-purity lanthanum, wherein the purity excluding rare-earth elements and gas components is 4N or higher, and amounts of aluminum, iron and copper in the lanthanum are respectively 100 wtppm or less. Similarly, it is possible to obtain a high-purity lanthanum sputtering target, wherein the purity excluding rare-earth elements and gas components is 4N or higher, amounts of aluminum, iron and copper in the lanthanum are respectively 100 wtppm or less, oxygen content is 1500 wtppm or less, elements of alkali metals and alkali earth metals are respectively 1 wtppm or less, elements of transition metals and high-melting-point metals other than those above are respectively 10 wtppm or less, and radioactive elements are respectively 10 wtppb or less.

In addition, as a result of sputtering the foregoing target, it is possible to obtain, on a substrate, a metal gate film mainly comprising high-purity lanthanum, wherein the purity excluding rare-earth elements and gas components is 4N or higher, and amounts of aluminum, iron and copper in the lanthanum are respectively 100 wtppm or less, as well as a metal gate film mainly comprising high-purity lanthanum, wherein the purity excluding rare-earth elements and gas components is 4N or higher, amounts of aluminum, iron and copper in the lanthanum are respectively 100 wtppm or less, oxygen content is 1500 wtppm or less, elements of alkali metals and alkali earth metals are respectively 1 wtppm or less, elements of transition metals and high-melting-point metals other than those above are respectively 10 wtppm or less, and radioactive elements are respectively 10 wtppb or less. The foregoing sputtering target and metal gate oxide film are both novel substances that are covered by the present invention.

The present invention yields a superior effect of being able to provide high-purity lanthanum, a sputtering target comprising high-purity lanthanum, and a thin film for metal gate mainly comprising high-purity lanthanum.

DETAILED DESCRIPTION OF THE INVENTION

In the present invention, as the lanthanum raw material to be subject to high purification, crude lanthanum (metal) having a purity of 3N or higher excluding gas components can be used. The foregoing raw material contains, as its main impurities, Li, Na, K, Ca, Mg, Al, Si, Ti, Fe, Cr, Ni, Mn, Mo, Ce, Pr, Nd, Sm, Ta, W, gas components (N, O, C and H), and the like. Commercially available examples are shown in Table 1 and Table 2.

Aluminum (Al) and copper (Cu) contained in lanthanum are often used as the alloy material for a substrate, source, drain and so on in a semiconductor, and will cause a malfunction if contained in the gate material even in a small amount. Moreover, since iron (Fe) contained in lanthanum is easily oxidized, it will cause defective sputtering when used as a target. In addition, even if iron (Fe) is not oxidized in the target, when it is oxidized after being sputtered, it becomes a particular problem since the volume will expand and it will cause defects such as insulation failure and subsequently cause malfunction. For the above reason, Fe must be reduced.

The raw material contains large amounts of Fe and Al. In addition, Cu is often contaminated from the water-cooling member that is used in producing crude metals through the reduction of chlorides and fluorides. These impurity elements often exist in the form of oxides in lanthanum of the raw material. In particular, since Fe has various forms such as metal, suboxide and oxide, it is necessary to form the raw material surface as a complete oxide by acid cleaning Fe with a solution such as nitric acid.

When performing electron beam melting, a low-power electron beam is irradiated to a broad range of the lanthanum raw material to be melted in a furnace so that the oxides of Al, Fe and Cu are reduced with the metal lanthanum, and the subsequent metals of Al, Fe and Cu are aggregated above and below the melted ingot based on the difference in specific gravity. It is thereby possible to obtain high-purity lanthanum from the center part of the ingot.

The foregoing alkali metal elements are lithium, sodium, potassium, rubidium, cesium and francium; and the alkali earth metal elements are calcium, strontium, barium and radium. These elements are electrically positive and, for example, if lanthanum is used as an electronic component, there is a problem in that the elements with a small atomic radius will easily move within the device and destabilize the properties of the device.

Although it will not cause any particular problem if the amount is small, the problem becomes significant if the amount is large. Accordingly, when using lanthanum as an electronic component material, it is desirable that the content of the respective elements is 1 wtppm or less. As many of these elements have a high vapor pressure, they can be eliminated efficiently since they will become volatilized by electron beam melting.

The foregoing transition metal elements are metals that belong to groups 3 to 11 in the periodic table, and representative examples thereof are titanium, vanadium, chromium, manganese, iron, cobalt, nickel, copper, zinc, and the like. These elements induce the increase of the leak current and cause the deterioration in pressure resistance. Moreover, the same applies to high-melting-point metals or heavy metals. Accordingly, when using lanthanum as an electronic component material, preferably, the elements of transition metals and high-melting-point metals or heavy metals other than those above are respectively 10 wtppm or less, and reduced as much as possible.

Representative examples of radioactive elements are uranium, actinium, thorium, lead and bismuth, and cause a soft error such that the accumulated charge of the memory cells becomes inverted. Accordingly, it is necessary to reduce the amounts of such radioactive elements as well as limit the alpha dose that is generated from such elements.

As the total amount of radioactive elements, the inclusion up to 20 wtppb can be tolerated, but should be reduced as much as possible. As described above, each of the foregoing elements can be individually analyzed and controlled, and it is preferable that these elements are respectively 10 wtppb or less.

As a result of measuring the alpha dose of the target of the present invention with a gas flow proportional counter as the measuring device, the alpha dose was 0.01 cph/cm$^2$ or less.

The reason why the rare-earth elements are excluded from the high-purity lanthanum as described above is because it is technically difficult to eliminate such rare-earth elements upon producing high-purity lanthanum since the other rare earths themselves have similar chemical properties as lanthanum, and, even if they are included as impurities, the properties will not be affected significantly since their properties are approximate.

Under the foregoing circumstances, the inclusion of other rare earths is silently approved to a certain degree, but it goes without saying that the inclusion of such other rare earths is reduced as much as possible in order to improve the properties of the lanthanum itself.

Moreover, the reason why the purity is 4N or higher excluding gas components is because the elimination of gas components is difficult, and, if such gas components are counted, it will no longer be a measure of the improvement of purity. Generally speaking, in many cases the existence of small amounts of gas components is harmless in comparison to other impurity elements.

Nevertheless, even in the foregoing cases, in particular, oxygen among the gas components gets easily mixed in, and will cause a major problem if its inclusion exceeds 5000 wtppm. In particular, if oxygen gets mixed into the target described later, splashes due to the oxygen will occur during the sputtering and uniform deposition cannot be performed.

In addition, the existence of oxides is undesirable since it will cause the generation of particles and nodules. Moreover, since it will have no small effect on the properties of the metal gate film described later, it goes without saying that it is necessary to reduce oxides as much as possible. Accordingly, it is desirable to strictly control the oxygen content as a matter of course. Preferably, the oxygen content is 1500 wtppm or less, and more preferably less than 1000 wtppm.

When forming a thin film for an electronic material such as a gate insulator film or a thin film for metal gate, such thin film is often produced by sputtering, and sputtering is a superior method as a means for forming a thin film. Accordingly, it is effective to use the foregoing lanthanum ingot to produce a high-purity lanthanum sputtering target.

The target can be produced with standard processes such as forging, rolling, machining, and finishing processing (polishing). In particular, there is no particular limitation in the production process, and it may be arbitrarily selected.

Based on the above, the present invention provides a high-purity lanthanum sputtering target, wherein the purity excluding rare-earth elements and gas components is 4N or higher, oxygen content is 1500 wtppm or less, elements of alkali metals are respectively 1 wtppm or less, amounts of aluminum, iron and copper are respectively 100 wtppm or less, other elements of transition metals are respectively 10 wtppm or less, and radioactive elements are respectively 10 wtppb or less. Upon producing the target, the foregoing high-purity lanthanum ingot is cut into a prescribed size, and it is subject to machining and polishing to produce a target.

Moreover, by sputtering this high-purity target, high-purity lanthanum can be deposited on a substrate, and the purity excluding rare-earth elements and gas components of 4N or higher and the oxygen content of 1500 wtppm or less, and even less than 1000 wtppm can be achieved. It is thereby possible to form, on a substrate, a metal gate film mainly comprising high-purity lanthanum, wherein elements of alkali metals and alkali earth metals are respectively 1 wtppm or less, amounts of aluminum, iron and copper in the lanthanum are respectively 100 wtppm or less, other elements of transition metals and high-melting-point metals are respectively 10 wtppm or less, and radioactive elements are respectively 10 wtppb or less. The composition of the target is reflected in the film on the substrate, and a high-purity lanthanum film is thereby formed.

The composition of the foregoing high-purity lanthanum can be used as is as the metal gate film, but the metal gate film can also be formed as a mixture or alloy or compound with another gate material. This can be achieved by co-sputtering with the target of another gate material or sputtering with a mosaic target. The present invention covers all of the above. The impurity content will vary depending on the impurity content contained in the raw material, but as a result of adopting the foregoing method, the respective impurities can be adjusted to be within the foregoing numerical range.

The present invention provides technology capable of efficiently and stably providing high-purity lanthanum, a sputtering target comprising high-purity lanthanum, and a thin film for metal gate mainly comprising high-purity lanthanum obtained as described above.

EXAMPLES

Examples of the present invention are now explained. Incidentally, these Examples are merely for facilitating the understanding of the invention, and the present invention shall in no way be limited thereby. In other words, various modifications and other embodiments based on the technical spirit claimed in the claims shall be covered by the present invention as a matter of course.

Example 1

The commercialized product shown in Table 1 was used as the lanthanum raw material to be treated. Since lanthanum itself is a material that has been attracting attention recently, the commercialized materials vary in purity and the actual condition is that the quality is not uniform. The commercialized product is one such example.

The commercially available lanthanum used in Example 1 is made of numerous block objects of approximately 10 to 20 mm. Since lanthanum is easily oxidizable, it is soaked in oil (liquid paraffin). Thus, acetone was eliminated by degreasing or, as needed, ultrasonic cleansing.

7.00 kg of raw material that was subject to the foregoing preliminary washing treatment was used. This raw material was immersed for 5 minutes in 1.5N nitric acid (10 parts of pure water was added to 1 part of 70% nitric acid) at a ratio of 10 liters of nitric acid solution in relation to 1 kg of lanthanum, and it was subsequently water washed and subject to ultrasonic cleansing in acetone for 30 minutes.

If nitric acid remains, oxygen in the EB (electron beam) melted ingot will increase; and if moisture remains, the degree of vacuum in the EB furnace will decrease. Thus, it is desirable to reduce the residual liquid of nitric acid and moisture as much as possible. An oxide film was formed on the lanthanum raw material based on the foregoing nitric acid treatment. The raw material after acid cleaning was 6.86 kg.

Subsequently, a 70 kW EB melting furnace was used to melt the raw material in a vacuum of $6.0 \times 10^{-5}$ to $7.0 \times 10^{-4}$ mbar and output for melting of 10 kW. This EB melting was performed twice. The EB melting time in each performance was 30 minutes. The EB melted ingot was prepared thereby. During the EB melting, highly-volatile substances were volatilized and eliminated. Since oxides are also easily volatilized in a vacuum, they were also reduced to a considerably low level.

It was possible to produce high-purity lanthanum based on the above. The analytical values of the high-purity lanthanum are shown in Table 1. As shown in Table 1, the lanthanum contained 12 wtppm of Al, 42 wtppm of Fe and 83 wtppm of Cu, and it is evident that they respectively achieved the condition of being 100 wtppm or less in the present invention.

The oxygen content was 440 wtppm, and this also achieved the preferable condition of the present invention; namely, being 1500 wtppm or less, and even more preferably less than 1000 wtppm.

Moreover, Li<0.1 wtppm, Na<0.1 wtppm, K<0.1 wtppm, Ca<0.1 wtppm, Mg<0.1 wtppm, Si<1 wtppm, Ti<0.1 wtppm, Ni<0.1 wtppm, Mn<0.1 wtppm, Mo<0.1 wtppm, Ta<1 wtppm, W<0.1 wtppm, U<0.010 wtppm, and Th<0.002 wtppm. They all achieved the favorable conditions of the present invention such that elements of alkali metals and alkali earth metals were respectively 1 wtppm or less, elements of transition metals and high-melting-point metals other than those above were respectively 10 wtppm or less, and radioactive elements were respectively 10 wtppb or less.

By way of reference, the rare-earth elements were as follows: Ce: 4.7 wtppm, Pr: 1.5 wtppm, Nd: 21 wtppm, and Sm: <0.05 wtppm. Although these are residual, the overall rare-earth elements were 50 wtppm or less, and it is evident that they have been reduced considerably in comparison to the contents in the raw material. This level of content will not impair the properties of lanthanum.

TABLE 1

|    | Commercialized Product 1 | Example 1 |
|----|--------------------------|-----------|
| Li | 750                      | <0.1      |
| Be | <0.1                     | <0.1      |
| B  | 2.6                      | 0.35      |
| F  | <5                       | <5        |
| Na | 1.4                      | <0.1      |
| Mg | 28                       | <0.1      |
| Al | 370                      | 12        |
| Si | 700                      | <1        |
| P  | 4.4                      | 1.6       |
| Cl | 5.2                      | <0.1      |
| K  | 0.02                     | <0.1      |
| Ca | 12                       | <0.1      |
| Sc | 0.02                     | <0.1      |
| Ti | 13                       | <0.1      |
| V  | 0.59                     | <0.1      |
| Cr | 31                       | 0.11      |
| Mn | 50                       | <0.1      |
| Fe | 410                      | 42        |
| Co | 10                       | <0.1      |
| Ni | 12                       | <0.1      |
| Cu | 150                      | 83        |
| Zn | 17.4                     | <0.1      |

TABLE 1-continued

|    | Commercialized Product 1 | Example 1 |
|----|--------------------------|-----------|
| Ga | <0.1                     | <0.1      |
| Ge | <0.1                     | <0.1      |
| As | <0.1                     | <0.1      |
| Se | <0.1                     | <0.1      |
| Br | <0.1                     | <0.1      |
| Rb | <0.1                     | <0.1      |
| Sr | <0.1                     | <0.1      |
| Y  | 1.6                      | 4         |
| Zr | 33                       | <0.1      |
| Nb | 10                       | 2.3       |
| Mo | 16                       | <0.1      |
| Ru | <0.1                     | <0.1      |
| Rh | <0.1                     | <0.1      |
| Pd | <0.1                     | <0.1      |
| Ag | <0.1                     | <0.1      |
| Cd | <0.1                     | <0.1      |
| In | <0.1                     | <0.1      |
| Sn | <0.1                     | <0.1      |
| Sb | <0.1                     | <0.1      |
| Te | <0.1                     | <0.1      |
| I  | <0.1                     | <0.1      |
| Cs | <0.1                     | <0.1      |
| Ba | <1                       | <1        |
| La | Matrix                   | Matrix    |
| Ce | 830                      | 4.7       |
| Pr | 78                       | 1.5       |
| Nd | 230                      | 21        |
| Sm | 210                      | <0.05     |
| Eu | 0.18                     | <0.05     |
| Gd | 0.95                     | 0.94      |
| Tb | 0.08                     | 0.18      |
| Dy | 0.93                     | <0.05     |
| Ho | 0.06                     | 0.07      |
| Er | 0.3                      | <0.1      |
| Tm | <0.1                     | <0.1      |
| Yb | <0.1                     | <0.1      |
| Lu | <0.1                     | <0.1      |
| Hf | <0.1                     | <0.1      |
| W  | 2.3                      | <0.1      |
| Re | <0.1                     | <0.1      |
| Os | <0.1                     | <0.1      |
| Ir | <0.1                     | <0.1      |
| Pt | <0.1                     | <0.1      |
| Au | <0.5                     | <0.5      |
| Hg | <0.1                     | <0.1      |
| Tl | <0.05                    | <0.05     |
| Pb | 11                       | 0.22      |
| Bi | <0.01                    | <0.01     |
| Th | 0.11                     | <0.002    |
| U  | 0.073                    | <0.010    |
| C  | 660                      | 160       |
| N  | <10                      | <10       |
| O  | 1600                     | 440       |
| S  | 13                       | <10       |
| H  | 17                       | 5.9       |

Unit: wtppm

The lanthanum ingot obtained as described above was subject to hot pressing as needed, additionally machined and polished to obtain a discoid target of φ140×14 t. The weight of this target was 1.42 kg. This target was further bonded with a backing plate to prepare a sputtering target. It was thereby possible to obtain a high-purity lanthanum sputtering target having the foregoing component composition. Incidentally, since this target has high oxidizability, it is preferably stored or transported by being vacuum-packed.

Example 2

The commercialized product shown in Table 2 was used as the lanthanum raw material to be treated. The commercially available lanthanum used in Example 2 has a tabular shape of 120 mm-square×30 mmt. The weight of a plate is 2.0 kg to 3.3 kg, and 12 plates were used as a total of 24 kg of raw material. Since the tabular lanthanum raw material is easily oxidizable, it was vacuum-packed in aluminum.

The raw material was removed from the vacuum packing and immersed for 5 minutes in 3N nitric acid (5 parts of pure water was added to 1 part of 70% nitric acid) at a ratio of 10 liters of nitric acid solution in relation to 1 kg of lanthanum, and it was subsequently water washed and subject to ultrasonic cleansing in acetone for 30 minutes. If nitric acid remains, oxygen in the EB (electron beam) melted ingot will increase; and if moisture remains, the degree of vacuum in the EB furnace will decrease. Thus, it is desirable to reduce the residual liquid of nitric acid and moisture as much as possible. This is due to the same reasons as Example 1.

An oxide film was formed on the lanthanum raw material based on the foregoing nitric acid treatment. The total raw material after acid cleaning was 23.78 kg.

Subsequently, a 400 kW large-sized EB melting furnace was used to melt the raw material in a vacuum of $7.0 \times 10^{-5}$ to $3.5 \times 10^{-5}$ mbar and output for melting of 96 kW, and casting was performed at a casting rate of 13 kg/h to prepare an ingot. During the EB melting, highly-volatile substances were volatilized and eliminated. Since oxides are also easily volatilized in a vacuum, they were also reduced to a considerably low level.

It was possible to produce 22.54 kg of a high-purity lanthanum ingot based on the above. The analytical values of the high-purity lanthanum are shown in Table 2. As shown in Table 2, the lanthanum contained 5.5 wtppm of Al, 3.5 wtppm of Fe and 2.8 wtppm of Cu, and it is evident that they respectively achieved the condition of being 100 wtppm or less in the present invention. In addition, the oxygen content was 550 wtppm, and this also achieved the preferable condition of the present invention; namely, being 1500 wtppm or less, and even more preferably less than 1000 wtppm.

Moreover, Li<0.1 wtppm, Na<0.1 wtppm, K<0.1 wtppm, Ca<0.1 wtppm, Mg<0.1 wtppm, Si<1 wtppm, Ti<0.1 wtppm, Cr<0.1 wtppm, Ni<0.1 wtppm, Mn<0.1 wtppm, Mo<0.1 wtppm, Ta<1 wtppm, W<0.1 wtppm, U<0.001 wtppm, and Th<0.001 wtppm.

In addition, they all achieved the favorable conditions of the present invention such that elements of alkali metals and alkali earth metals were respectively 1 wtppm or less, elements of transition metals and high-melting-point metals other than those above were respectively 10 wtppm or less, and radioactive elements were respectively 10 wtppb or less.

By way of reference, the rare-earth elements were as follows: Ce: 6.8 wtppm, Pr: 2.6 wtppm, Nd: 34 wtppm, and Sm: <0.1 wtppm. Although these are residual, the overall rare-earth elements were 50 wtppm or less, and it is evident that they have been reduced considerably in comparison to the contents in the raw material. This level of content will not impair the properties of lanthanum.

TABLE 2

|  | Commercialized Product 2 | Example 2 |
|---|---|---|
| Li | 250 | <0.1 |
| Be | <0.1 | <0.1 |
| B | 2.4 | 0.7 |
| F | <5 | <5 |
| Na | 2.0 | <0.1 |
| Mg | 41 | <0.1 |
| Al | 110 | 5.5 |
| Si | 74 | <1 |
| P | 8 | 3 |

TABLE 2-continued

|  | Commercialized Product 2 | Example 2 |
|---|---|---|
| Cl | 0.65 | <0.1 |
| K | <0.1 | <0.1 |
| Ca | 53 | <0.1 |
| Sc | <0.1 | <0.1 |
| Ti | 0.57 | <0.1 |
| V | <0.1 | <0.1 |
| Cr | <0.1 | <0.1 |
| Mn | 2.4 | <0.1 |
| Fe | 170 | 3.5 |
| Co | <0.1 | <0.1 |
| Ni | 0.18 | <0.1 |
| Cu | 103 | 2.8 |
| Zn | <0.1 | <0.1 |
| Ga | <0.1 | <0.1 |
| Ge | <0.1 | <0.1 |
| As | <0.1 | <0.1 |
| Se | <0.1 | <0.1 |
| Br | <0.1 | <0.1 |
| Rb | <0.1 | <0.1 |
| Sr | <0.1 | <0.1 |
| Y | 1.9 | 1.5 |
| Zr | 0.1 | <0.1 |
| Nb | 3.8 | 3.3 |
| Mo | <0.1 | <0.1 |
| Ru | <0.1 | <0.1 |
| Rh | 0.19 | <0.1 |
| Pd | <0.1 | <0.1 |
| Ag | <0.1 | <0.1 |
| Cd | <0.1 | <0.1 |
| In | <0.1 | <0.1 |
| Sn | <0.1 | <0.1 |
| Sb | <0.1 | <0.1 |
| Te | <0.1 | <0.1 |
| I | <0.1 | <0.1 |
| Cs | <0.1 | <0.1 |
| Ba | <1 | <1 |
| La | Matrix | Matrix |
| Ce | 37 | 6.8 |
| Pr | 9.4 | 2.6 |
| Nd | 42 | 34 |
| Sm | <0.1 | <0.1 |
| Eu | 1.8 | <0.1 |
| Gd | 2.3 | 1.3 |
| Tb | 0.6 | 0.22 |
| Dy | <0.1 | <0.1 |
| Ho | <0.1 | <0.1 |
| Er | <0.1 | <0.1 |
| Tm | <0.1 | <0.1 |
| Yb | <0.1 | <0.1 |
| Lu | <0.1 | <0.1 |
| Hf | <0.1 | <0.1 |
| W | 0.17 | 0.1 |
| Re | <0.1 | <0.1 |
| Os | <0.1 | <0.1 |
| Ir | <0.1 | <0.1 |
| Pt | <0.1 | <0.1 |
| Au | <0.5 | <0.5 |
| Hg | <0.1 | <0.1 |
| Tl | <0.05 | <0.05 |
| Pb | 0.2 | 0.2 |
| Bi | <0.1 | <0.1 |
| Th | <0.03 | <0.001 |
| U | 0.011 | <0.001 |
| C | 280 | 210 |
| N | 190 | <10 |
| O | 2600 | 550 |
| S | 16 | <10 |
| H | 45 | 7.7 |

Unit: wtppm

The lanthanum ingot obtained as described above was subject to hot pressing as needed, additionally machined and polished to obtain a discoid target of ϕ140×14 t. This target was further bonded with a backing plate to prepare a sputtering target. It was thereby possible to obtain a high-purity lanthanum sputtering target having the foregoing component composition. Incidentally, since this target has high oxidizability, it is preferably stored or transported by being vacuum-packed.

The high-purity lanthanum, a sputtering target comprising high-purity lanthanum, and a thin film for metal gate mainly comprising high-purity lanthanum obtained with the present invention are useful as materials of a gate insulator film or a thin film for metal gate since they will not, as electronic materials to be disposed in the vicinity of the silicon substrate, deteriorate or disturb the functions of electronic devices.

The invention claimed is:

1. A sputtering target comprising high purity lanthanum, wherein the purity excluding rare-earth elements and gas components is 4N or higher, contents of aluminum, iron and copper in the lanthanum are respectively 100 wtppm or less, oxygen content is 1500 wtppm or less, contents of alkali metal elements and alkali earth metal elements are respectively 1 wtppm or less, contents of transition metal elements and high-melting-point metal elements other than those above are respectively 10 wtppm or less, and contents of radioactive elements are respectively 10 wtppb or less.

2. A sputtering target according to claim 1, wherein the alkali metal elements include lithium, sodium, potassium, rubidium, cesium and francium, and the alkali earth metal elements include calcium, strontium, barium and radium, and wherein the content of each is 1 wtppm or less.

3. A sputtering target according to claim 2, wherein the content of each of lithium, sodium, potassium, rubidium, cesium, calcium and strontium is less than 0.1 wtppm.

4. A metal gate film mainly comprising high purity lanthanum, wherein the purity excluding rare-earth elements and gas components is 4N or higher, contents of aluminum, iron and copper in the lanthanum are respectively 100 wtppm or less, oxygen content is 1500 wtppm or less, contents of alkali metal elements and alkali earth metal elements are respectively 1 wtppm or less, contents of transition metal elements and high-melting-point metal elements other than those above are respectively 10 wtppm or less, and contents of radioactive elements are respectively 10 wtppb or less.

5. A metal gate film according to claim 4, wherein the alkali metal elements include lithium, sodium, potassium, rubidium, cesium and francium, and the alkali earth metal elements include calcium, strontium, barium and radium, and wherein the content of each is 1 wtppm or less.

6. A metal gate film according to claim 5, wherein the content of each of lithium, sodium, potassium, rubidium, cesium, calcium and strontium is less than 0.1 wtppm.

7. A metal gate film according to claim 6, wherein the metal gate film is a gate insulator film of a MOSFET.

8. A method of producing high purity lanthanum, comprising the steps of:

subjecting a lanthanum raw material to nitric acid treatment to form an oxide film on the lanthanum raw material, washing and ultrasonic cleansing the lanthanum raw material to remove nitric acid and moisture from the lanthanum raw material after said step of subjecting the lanthanum raw material to nitric acid treatment, after said step of washing and ultrasonic cleansing, EB (electron beam) melting the lanthanum raw material to eliminate the oxide film on a surface of the lanthanum raw material and oxide contained in the lanthanum raw material, repeating said electron beam melting, after said step of repeating said electron beam melting, solidifying and forming an ingot of high purity lanthanum such that oxygen content is 1500 wtppm or less, the purity of the lanthanum excluding rare-earth elements and gas components is 4N or higher, contents of aluminum, iron and copper in the lanthanum are respectively 100 wtppm or less, contents of alkali metal elements and alkali earth metal elements are respectively 1 wtppm or less, contents of transition metal elements and high-melting-point metal elements other than those above are respectively 10 wtppm or less, and radioactive elements are respectively 10 wtppb or less, cutting the ingot of high purity lanthanum to produce a sputtering target, and machining and polishing the sputtering target.

* * * * *